United States Patent [19]

Hill

[11] Patent Number: 5,286,997

[45] Date of Patent: Feb. 15, 1994

[54] METHOD FOR FORMING AN ISOLATED, LOW RESISTANCE EPITAXIAL SUBCOLLECTOR FOR BIPOLAR TRANSISTORS

[75] Inventor: Darrell Hill, Plano, Tex.

[73] Assignee: Texas Instruments Incorporated, Dallas, Tex.

[21] Appl. No.: 860,843

[22] Filed: Mar. 31, 1992

[51] Int. Cl.[5] .................. H01L 29/34; H01L 21/20
[52] U.S. Cl. ............................ 257/586; 257/586; 257/197; 257/623; 437/84; 437/107; 437/133; 437/228; 437/249; 437/947
[58] Field of Search ................ 257/197, 586, 623; 437/84, 107, 133, 228, 249, 947

[56] References Cited

U.S. PATENT DOCUMENTS 4,825,265  4/1989  Lunardi et al. .................. 257/586

OTHER PUBLICATIONS

Burhan Bayraktaroglu et al., "p-n-p Heterojunction Bipolar Transistors with Buried Subcollector Layers", *IEEE Electron Device Letters*, vol. 10, No. 3, pp. 120-122, Mar. 1989.

*Primary Examiner*—Edward Wojciechowicz
*Attorney, Agent, or Firm*—Michael K. Skrehot; James C. Kesterson; Richard L. Donaldson

[57] ABSTRACT

Generally, and in one form of the invention a method is disclosed for forming a subcollector for bipolar transistors comprising the steps of epitaxially depositing a subcollector layer 22 on a substrate 20, the subcollector containing a co-deposited dopant; etching the subcollector layer to define an active device region; depositing a collector layer 24 above the subcollector layer; depositing a base layer 25 above the collector layer 24; and depositing an emitter layer 27 above the base layer 25, whereby the subcollector layer does not extend beyond the active device region and is of low resistance.

20 Claims, 2 Drawing Sheets

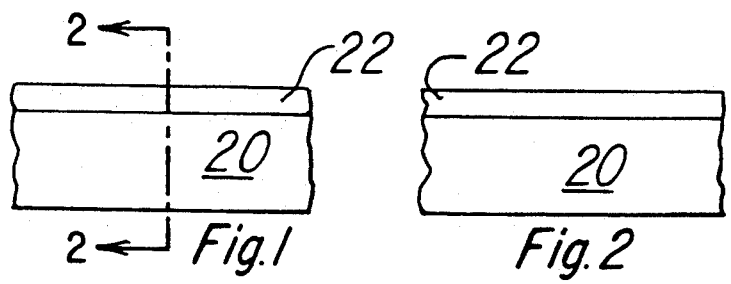
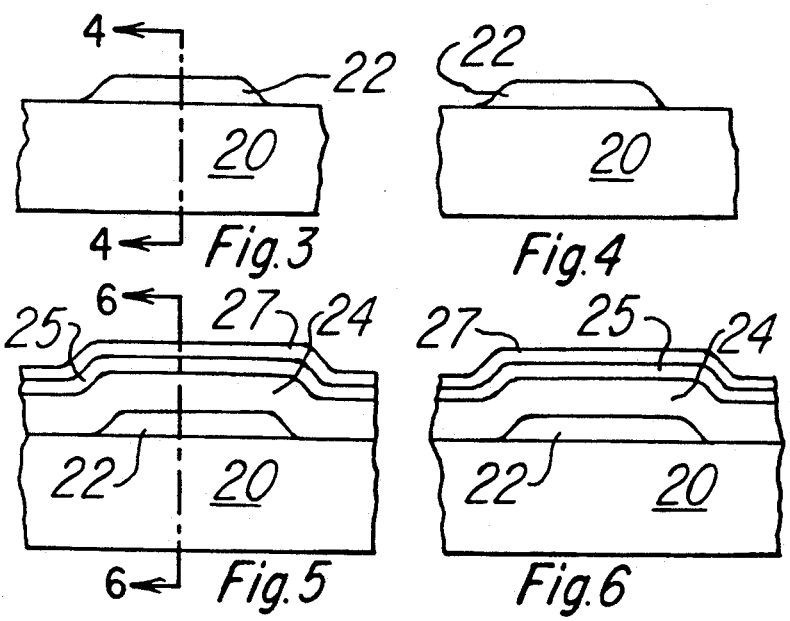
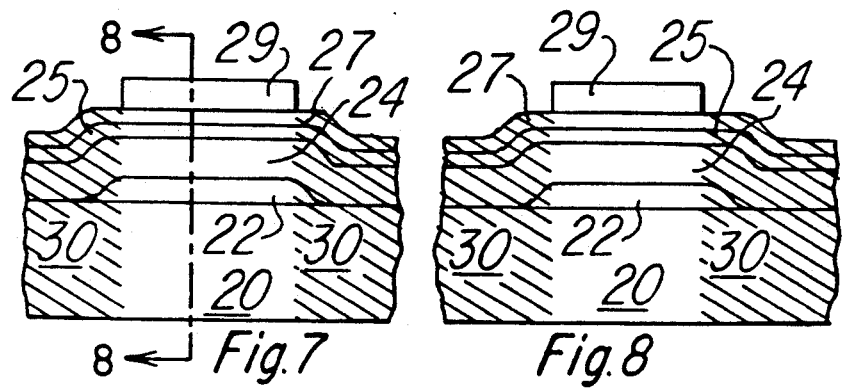
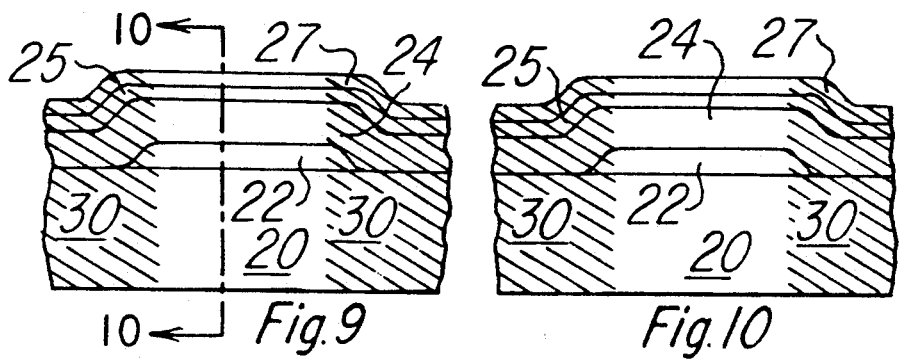

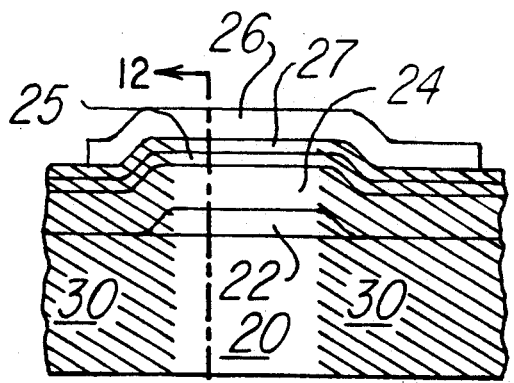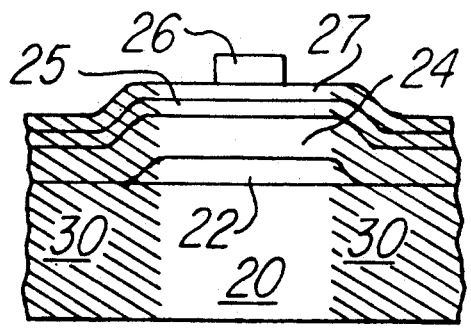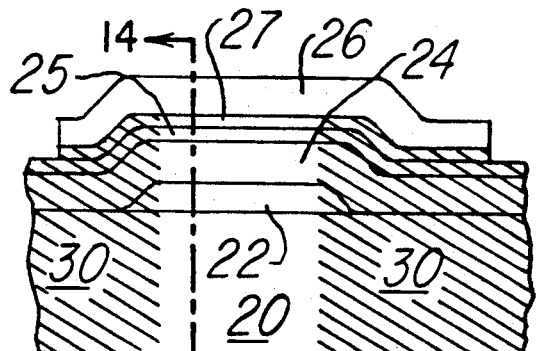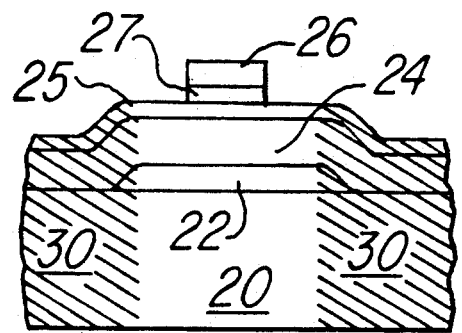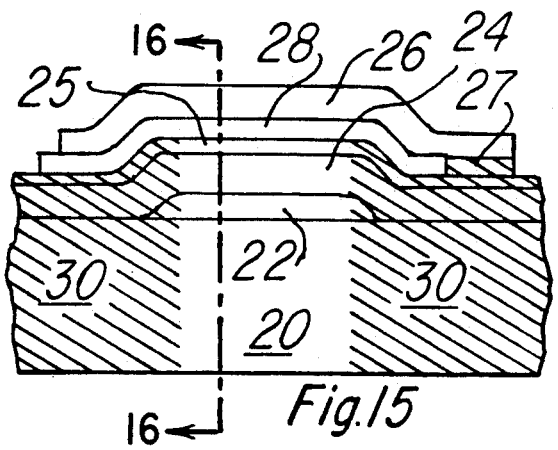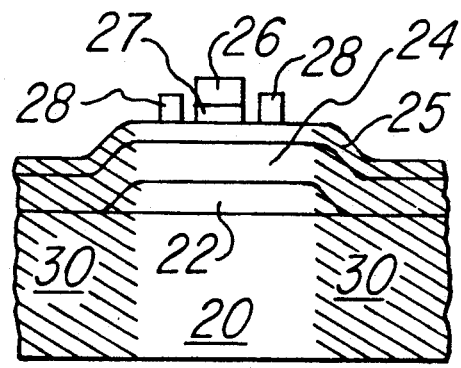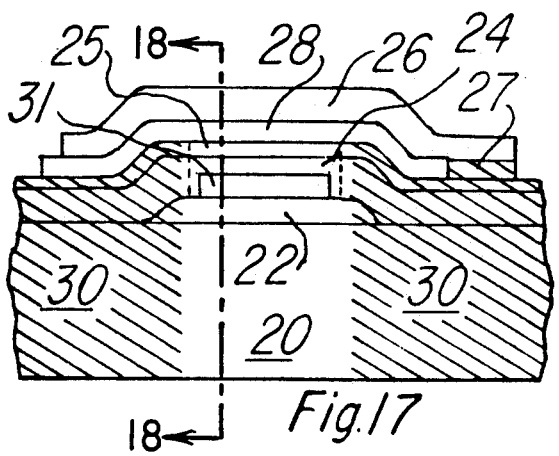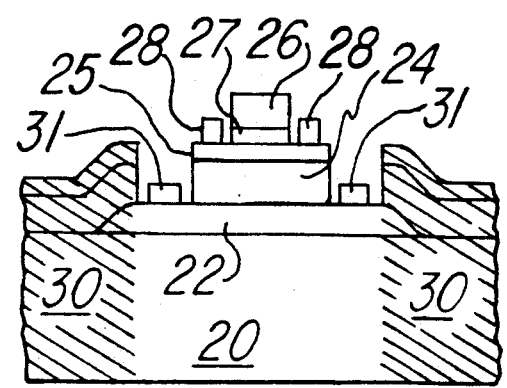

METHOD FOR FORMING AN ISOLATED, LOW RESISTANCE EPITAXIAL SUBCOLLECTOR FOR BIPOLAR TRANSISTORS

This invention was made with Government support under Contract Number F33615-90-C-1480 awarded by the Air Force Systems Command. The Government has certain rights in this invention.

FIELD OF THE INVENTION

This invention generally relates to forming an isolated, low-resistance epitaxial subcollector for bipolar transistors.

BACKGROUND OF THE INVENTION

Without limiting the scope of the invention, its background is described in connection with semiconductor devices, as an example.

Heretofore, in this field, bipolar transistors have employed a heavily doped subcollector layer to reduce series collector resistance. However, the heavily-doped layer can cause increased parasitic capacitance if it extends outside of the active device region. This problem is particularly acute for pnp Heterojunction Bipolar Transistors (HBTs) in AlGaAs/GaAs. Since hole mobility is much lower than electron mobility in GaAs, the pnp subcollector layer must be much more heavily doped to achieve the same sheet resistance as compared to npn HBTs. Solutions that have been used in the past to overcome this problem include: mesa isolation, in which the epitaxial layers of an HBT structure are etched away; ion bombardment to increase the resistivity of portions of the subcollector; and patterned ion implantation of the subcollector, in which the subcollector is formed by ion implantation only in the device active area.

SUMMARY OF THE INVENTION

It is herein recognized that a need exists for a method for forming an isolated, low resistance subcollector for bipolar transistors. The present invention is directed toward meeting that need.

Past solutions to the need for an isolated low-resistance subcollector region include mesa isolation, ion bombardment to increase the resistivity of portions of the subcollector, and formation of the subcollector by patterned ion implantation. These solutions all have problems that limit their usefulness.

In mesa isolation, the epitaxial layers of the device structure, including the subcollector, are etched away so that no conductive layers are present between active device regions. If the etched edge is near-vertical, a large step will have to be traversed by metallization used for contacts, leading to loss of device yield. If the etched edge is sloped, then any metal running along the slope will have significant capacitance to the underlying conductive layers. Also, an insulating layer may be required between the contact metallization and the exposed subcollector layer to prevent undesirable leakage current between the metal and the subcollector; this insulating layer complicates fabrication.

Ion bombardment is sometimes used to increase the resistivity of semiconductor structures. However, this method has two significant limitations. First, the thickness of the structure must be no greater than the depth to which the ions can be driven; this depth is determined by available acceleration energy of the ion implant equipment, and is a significant limitation. Second, the effectiveness of this method decreases as the doping density of the semiconductor structure is increased. Layers with very high doping levels cannot be made sufficiently resistive. Taken together, these two limitations impose an upper bound on the conductivity of the subcollector layer.

In the third alternative, the subcollector is formed by patterned ion implantation prior to overgrowth of the rest of the device structure. Donor (for npn) or acceptor (for pnp) ions are implanted into the substrate only in those regions where active devices are to be formed. The implanted ions are then activated by annealing, and the rest of the transistor structure is epitaxially overgrown. This method also has significant limitations. For some semiconductors (such as GaAs), the doping concentration attainable by ion implantation is significantly lower than can be obtained during epitaxial growth. In addition, the total implanted dose required to form a thick, heavily-doped subcollector is very high. Even after annealing of the substrate, such high doses leave substantial damage; this damage typically results in degraded morphology of the subsequent epitaxial overgrowth, hindering device fabrication.

Generally, and in one form of the invention a method is disclosed for forming a subcollector for bipolar transistors comprising the steps of epitaxially depositing a subcollector layer on a substrate, the subcollector layer containing a co-deposited dopant; etching the subcollector layer to define an active device region; depositing a collector layer above the subcollector layer; depositing a base layer above the collector layer; and depositing an emitter layer above the base layer, whereby the subcollector layer does not extend beyond the active device region and is of low resistance. The bipolar transistor resulting from this process is particularly suited to high-frequency analog applications where low parasitic capacitances and resistance are required.

One advantage of the inventive process is that the surface is more nearly planar than is obtained with the mesa isolation technique, since the step height is determined only by the subcollector thickness, rather than by the total epitaxial layer thickness of the device (subcollector, collector, base, and emitter). Also, in this process the heavily-doped subcollector layer is not exposed along the etched edge, because there is at least a lightly-doped collector layer over it. This allows the etched edge to be sloped without intimate contact between the subcollector layer and any overlying metal. The sloped edge gives higher device yield than would be the case with routing metallization over the near-vertical side walls resulting from the mesa isolation technique. The lack of intimate contact between the subcollector layer and overlying metal reduces capacitance; additionally, the lack of intimate contact eliminates the need for insulating material between the semiconductor surface and overlying metallization in some cases, since the lightly-doped collector (unlike the heavily-doped subcollector) may be rendered semi-insulating in some semiconductors (such as GaAs).

The inventive process has two advantages over the ion bombardment approach. First, the inventive process does not suffer from the structure thickness limitation imposed by ion implant depth; there is no fundamental limit on the thickness of the subcollector under this process. Second, the effectiveness of the inventive process is independent of the doping density of the subcollector layer.

An advantage of this inventive process over the patterned ion implantation approach is that it does not impose any limits on the subcollector doping level. The doping may therefore be increased to the maximum attainable during epitaxial growth. Also, the morphology of the subsequent overgrowth is not degraded at all.

BRIEF DESCRIPTION OF THE DRAWINGS

In the drawings:

FIG. 1 is a cross-sectional side view showing the substrate and subcollector layer of the structure resulting from the preferred embodiment process;

FIG. 2 is a cross-sectional end view of FIG. 1;

FIG. 3 is a cross-sectional side view showing the etched subcollector mesa of the structure resulting from the preferred embodiment process;

FIG. 4 is a cross-sectional end view of FIG. 3;

FIG. 5 is a cross-sectional side view showing the emitter, base, and collector layers of the structure resulting from the preferred embodiment process;

FIG. 6 is a cross-sectional end view of FIG. 5;

FIG. 7 is a cross-sectional side view showing the protective photoresist and pattern of Boron implant in the preferred embodiment process;

FIG. 8 is a cross-sectional end view of FIG. 7;

FIG. 9 is a cross-sectional side view of the structure after the removal of the protective photoresist;

FIG. 10 is a cross-sectional end view of FIG. 9;

FIG. 11 is a cross-sectional side view showing the patterned emitter metal of the structure;

FIG. 12 is a cross-sectional end view of FIG. 11;

FIG. 13 is a cross-sectional side view showing the structure with the emitter layer etched down to the base layer;

FIG. 14 is a cross-sectional end view of FIG. 3;

FIG. 15 is a cross-sectional side view showing the addition of the base metallization;

FIG. 16 is a cross-sectional end view of FIG. 15;

FIG. 17 is a cross-sectional side view showing the patterned etch to the subcollector layer, as well as the collector contact metallization;

FIG. 18 is a cross-sectional end view of FIG. 17.

Corresponding numerals and symbols in the different figures refer to corresponding parts unless otherwise indicated.

DETAILED DESCRIPTION OF PREFERRED EMBODIMENTS

A diagram of the first preferred embodiment process is shown in FIGS. 1-18. The steps involved in this process are described in the following:

(a) A subcollector layer 22 of p-type GaAs, for example, is epitaxially grown on a substrate of semi-insulating GaAs 20 by a suitable process (such as molecular beam epitaxy or metal organic chemical vapor deposition) to a thickness of preferably 1 $\mu$m and doped with C, for example, to a concentration of approximately $5 \times 10^{19}$ cm$^{-3}$ [FIGS. 1 and 2]. C is preferred as its diffusivity is very low (e.g. as compared to Zn).

(b) The substrate is removed from the epitaxial growth chamber and conventional photolithographic techniques employing photoresist are used to etch away the subcollector layer outside of the regions where active devices are desired. If desired, wet chemical etching may be used to give sloping sidewalls at the edges of the subcollector regions [FIGS. 3 and 4].

(c) The substrate is cleaned in solvents and submitted to an oxygen plasma to remove organic residue. The substrate is dipped in diluted hydrochloric acid to remove the surface layer oxidized by the plasma, and then reintroduced into the epitaxial growth chamber.

(d) A collector layer 24 is epitaxially grown of, for example, GaAs, preferably 1 $\mu$m thick, doped at approximately $1 \times 10^{16}$ cm$^{-3}$ with C, for example.

(e) A base layer 25 is grown of, for example, GaAs, preferably 50 nm thick, doped at approximately $5 \times 10^{18}$ cm$^{-3}$ with Si, for example.

(f) An emitter layer, of AlGaAs for example, and emitter cap layer 27, shown as one layer for clarity, are grown; the emitter layer is preferably 50 nm thick, doped at approximately $5 \times 10^{17}$ cm$^{-3}$ with C, for example; the emitter cap layer is preferably 50 nm thick, doped at approximately $5 \times 10^{19}$ cm$^{-3}$ with C, for example [FIGS. 5 and 6].

(g) Photoresist 29 is applied to protect the active device area inside the subcollector mesa, and then B, for example, is implanted at approximately 80 keV to a total dose of approximately $5 \times 10^{13}$ cm$^{-3}$. [FIGS. 7 and 8] This converts the emitter, base, and collector layers outside the subcollector mesa to semi-insulating, shown in FIGS. 7 through 18 by shaded region 30. The photoresist is then removed resulting in the structure of FIGS. 9 and 10.

(h) Photoresist (not shown) is used to define a metal emitter contact 26 consisting of, for example, 20 nm Ti/20 nm Pt/100 nm Au [FIGS. 11 and 12].

(i) 1:8:160 ($H_2SO_4$:$H_2O_2$:$H_2O$), for example, is used to etch to expose the base layer 25; the emitter contact metal serves as a natural mask [FIGS. 13 and 14].

(j) Photoresist (not shown) is used to define a metal base contact 28 consisting of, for example, 20 nm Ti/20 nm Pt/100 nm Au, which are deposited by evaporation. The excess metallization is then lifted off with the photoresist [FIGS. 15 and 16].

(k) Photoresist (not shown) is used for a patterned etch to expose the subcollector layer 22. The same photoresist is used in a lift off process to deposit collector contact metal 31, for example, 20 nm Ti/20 nm Pt/100 nm Au [FIGS. 17 and 18].

A preferred embodiment has been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a bipolar transistor comprising the steps of:

epitaxially depositing a subcollector layer on a substrate, said subcollector layer containing a co-deposited dopant;

forming a mesa, said mesa comprising a portion of said subcollector layer extending above said substrate, said mesa having sidewalls that define the bounds of an active region;

depositing a collector layer to cover said mesa and said sidewalls;

depositing a base layer atop said collector layer; and depositing an emitter layer atop said base layer.

2. The method of claim 1 wherein said substrate is GaAs.

3. The method of claim 1 wherein said collector, base, and emitter layers are epitaxially deposited.

4. The method of claim 1 wherein said subcollector layer is doped at a concentration in excess of $2 \times 10^{19}$ atoms/cm$^3$.

5. The method of claim 1 wherein said subcollector layer is doped p-type.

6. The method of claim 1 wherein said sidewalls are sloped.

7. The method of claim 1 further comprising the step of depositing metallization on said base and said emitter layers, wherein said metallization is separated from said sidewalls of said mesa by said collector layer.

8. The method of claim 1 further comprising the step of depositing metallization on said emitter and base layers wherein said metallization lies above said subcollector layer only within said bounds of said active region, whereby a capacitance between said metallization and said subcollector layer is lessened.

9. The method of claim 1 wherein said bipolar transistor is a heterojunction bipolar transistor.

10. A heterojunction bipolar transistor structure comprising:

a substrate;

a mesa, said mesa comprising a portion of a subcollector layer extending above said substrate, said mesa having sidewalls that define the bounds of an active region;

a collector layer, wherein said collector layer covers said mesa and said sidewalls;

a base layer, wherein said base layer lies atop said collector layer; and an emitter layer, wherein said emitter layer lies atop said base layer.

11. The bipolar transistor of claim 10 wherein said emitter layer and said base layer are comprised of materials having different energy bandgaps.

12. The bipolar transistor of claim 10 further comprising metallization on said base and said emitter layers, wherein said metallization is separated from said sidewalls of said mesa by said collector layer.

13. The structure of claim 10 wherein said subcollector layer is doped at a concentration in excess of $2 \times 10^{19}$ cm$^{-3}$.

14. The bipolar transistor of claim 10 further comprising metallization on said emitter and base layers wherein said metallization lies above said subcollector layer only within said bounds of said active region, whereby a capacitance between said metallization and said subcollector layer is lessened.

15. The bipolar transistor of claim 10 wherein said emitter layer is AlGaAs and wherein said base layer is GaAs.

16. The bipolar transistor of claim 10 wherein said sidewalls are sloped.

17. A method for forming a pnp heterojunction bipolar transistor comprising the steps of:

epitaxially depositing a subcollector layer of p-type GaAs on a GaAs substrate;

etching portions of said subcollector to form a mesa, said mesa comprising a portion of said subcollector layer and having sidewalls that define the bounds of an active region;

epitaxially depositing a collector layer of p-type GaAs to cover said mesa and said sidewalls;

epitaxially depositing a base layer of n-type GaAs atop said collector layer;

epitaxially depositing an emitter layer of p-type AlGaAs atop said base layer; and depositing metallization on said base emitter layers, wherein said metallization is separated from said sidewalls of said mesa by said collector layer.

18. The method of claim 17 wherein said subcollector layer is doped in situ with Carbon to a concentration in excess of approximately $2 \times 10^{19}$ cm$^{-3}$.

19. The method of claim 17 further comprising the step of depositing metallization on said emitter and base layers wherein said metallization lies above said subcollector layer only within said bounds of said active region, whereby a capacitance between said metallization and said subcollector layer is lessened.

20. The method of claim 17 wherein said sidewalls are sloped.

* * * * *